(12) United States Patent
Yaung et al.

(10) Patent No.: US 10,490,580 B2
(45) Date of Patent: *Nov. 26, 2019

(54) IMAGE SENSOR PICKUP REGION LAYOUT

(71) Applicant: Taiwan Semiconductor Manufacturing Company, Ltd., Hsinchu (TW)

(72) Inventors: Dun-Nian Yaung, Taipei (TW); Ching-Chun Wang, Tainan (TW); Feng-Chi Hung, Chu-Bei (TW); Jeng-Shyan Lin, Tainan (TW); Yan-Chih Lu, Tainan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/864,800

(22) Filed: Jan. 8, 2018

(65) Prior Publication Data

US 2018/0151613 A1 May 31, 2018

Related U.S. Application Data

(63) Continuation of application No. 15/206,061, filed on Jul. 8, 2016, now Pat. No. 9,865,630, which is a continuation of application No. 14/157,063, filed on Jan. 16, 2014, now Pat. No. 9,391,101.

(60) Provisional application No. 61/900,265, filed on Nov. 5, 2013.

(51) Int. Cl.
*H01L 27/146* (2006.01)

(52) U.S. Cl.
CPC .. *H01L 27/14605* (2013.01); *H01L 27/14603* (2013.01); *H01L 27/14607* (2013.01); *H01L 27/14643* (2013.01); *H01L 27/14689* (2013.01)

(58) Field of Classification Search
CPC .................. H01L 27/14605; H01L 27/14607
USPC .......................................................... 257/443
See application file for complete search history.

(56) References Cited

U.S. PATENT DOCUMENTS

| | | | | |
|---|---|---|---|---|
| 4,368,884 A * | 1/1983 | Colvin | ............... | A63B 21/4029 482/104 |
| 4,799,673 A * | 1/1989 | Selle | .................... | A63B 21/078 482/104 |
| 6,926,648 B2 * | 8/2005 | Capizzo | ............... | A63B 21/078 482/104 |
| 7,585,259 B2 * | 9/2009 | Turner | .................. | A63B 21/078 482/104 |
| 8,876,672 B2 * | 11/2014 | Schiano | ............... | A63B 21/078 482/104 |
| 8,878,122 B2 * | 11/2014 | Yokogawa | ........... | G02B 3/0006 250/208.1 |
| 9,717,943 B2 * | 8/2017 | Klonoski | ............. | A63B 21/078 |
| 2005/0167709 A1 | 8/2005 | Augusto | | |

(Continued)

*Primary Examiner* — Tuan N Nguyen
(74) *Attorney, Agent, or Firm* — Slater Matsil, LLP

(57) ABSTRACT

Embodiments of the present disclosure include an image sensor device and methods of forming the same. An embodiment is an image sensor device including a first plurality of pickup regions in a photosensor array area of a substrate, each of first plurality of pickup regions having a first width and a first length, a second plurality of pickup regions in a periphery area of the substrate, the periphery area along at least one side of the photosensor array area, each of second plurality of pickup regions having a second width and a second length.

19 Claims, 2 Drawing Sheets

(56) References Cited

U.S. PATENT DOCUMENTS

| | | | |
|---|---|---|---|
| 2005/0233493 A1* | 10/2005 | Augusto | G02B 1/005 438/51 |
| 2006/0114342 A1* | 6/2006 | Egawa | H04N 5/361 348/241 |
| 2006/0145221 A1 | 7/2006 | Lee | |
| 2007/0092986 A1 | 4/2007 | Chen et al. | |
| 2007/0131992 A1* | 6/2007 | Dosluoglu | H01L 27/14609 257/292 |
| 2008/0197268 A1* | 8/2008 | Kameda | H01L 27/14623 250/208.1 |
| 2008/0315104 A1* | 12/2008 | Nam | H01L 27/14603 250/370.08 |
| 2010/0110271 A1 | 5/2010 | Yanagita et al. | |
| 2010/0289941 A1* | 11/2010 | Ito | G02B 7/365 348/345 |
| 2011/0024808 A1* | 2/2011 | Janesick | H01L 27/14609 257/292 |
| 2013/0009267 A1* | 1/2013 | Henseler | G01T 1/248 257/443 |
| 2013/0033467 A1 | 2/2013 | Kohtoku | |

* cited by examiner

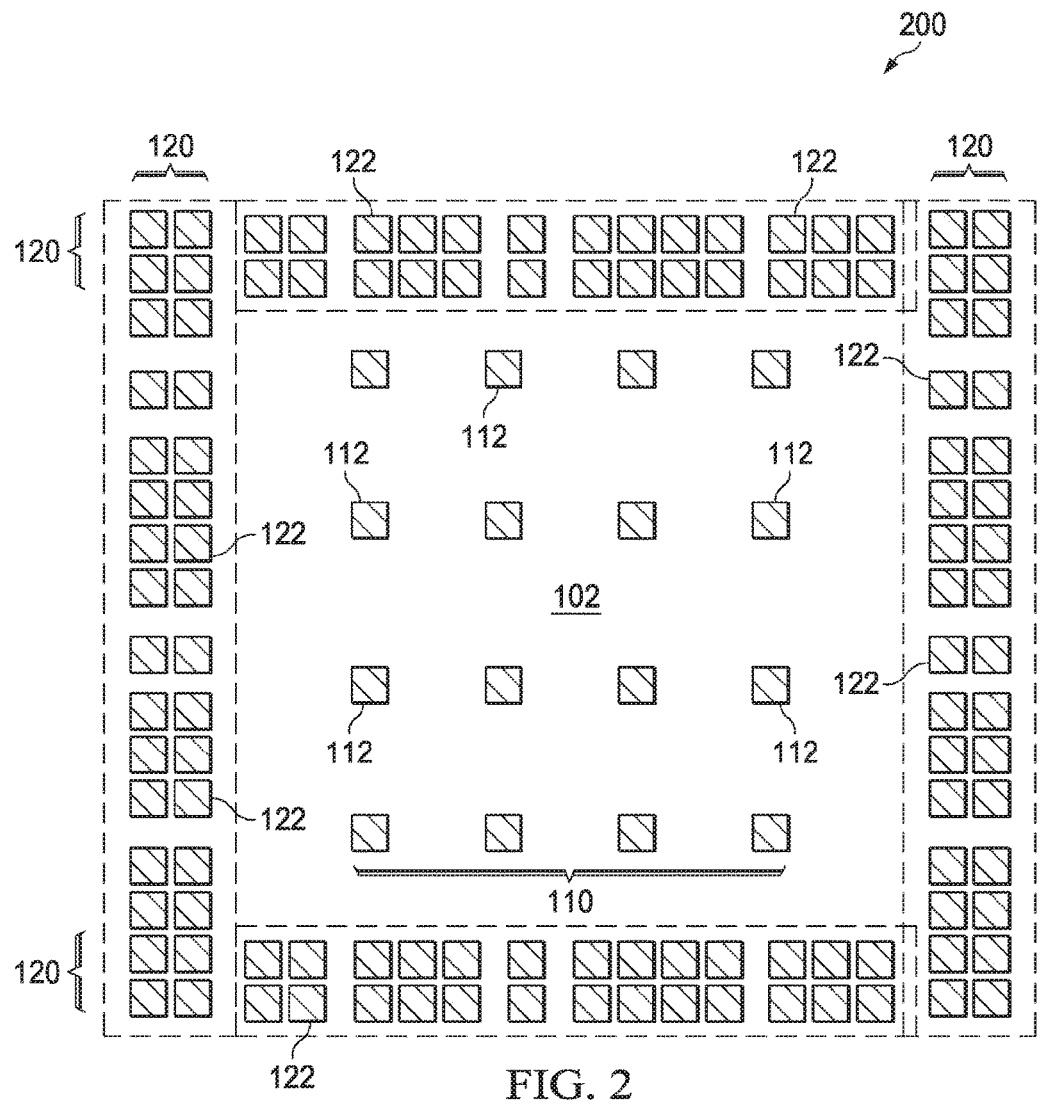
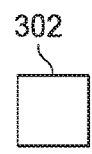
FIG. 3A
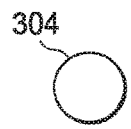
FIG. 3B
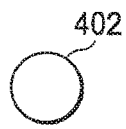
FIG. 4A
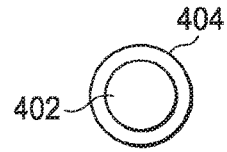
FIG. 4B

IMAGE SENSOR PICKUP REGION LAYOUT

CROSS-REFERENCE TO RELATED APPLICATIONS

This application is a continuation of Ser. No. 15/206,061, filed Jul. 8, 2016, entitled, "Image Sensor Pickup Region Layout," which is a continuation of U.S. patent application Ser. No. 14/157,063, filed Jan. 16, 2014, (now U.S. Pat. No. 9,391,101, issued Jul. 12, 2016) entitled "Image Sensor Pickup Region Layout," which claims the benefit of U.S. Provisional Application No. 61/900,265, filed on Nov. 5, 2013, entitled "Image Sensor Pickup Region Layout," which patent applications are incorporated herein by reference.

BACKGROUND

A Metal-oxide semiconductor (MOS) image sensor typically comprises an array of picture elements (pixels), which utilizes light-sensitive MOS circuitry to convert photons into electrons. The light-sensitive MOS circuitry typically comprises a photodiode formed in a silicon substrate. As the photodiode is exposed to light, an electrical charge is induced in the photodiode. Each sensor, or pixel, may generate electrons proportional to the amount of light that falls on the pixel when light is incident on the pixel from a subject scene. The electrons are converted into a voltage signal in the pixel and further transformed into a digital signal which will be processed by an application specific integrated circuit (ASIC) or other circuitry.

A MOS image sensor, or simply a MOS sensor, may have a front side where a plurality of dielectric layers and interconnect layers are located connecting the photodiode in the substrate to peripheral circuitry, and a backside having the substrate. A MOS sensor is a front-side illuminated (FSI) image sensor if the light is from the front side of the sensor; otherwise, it is a back-side illuminated (BSI) sensor with light incident on the backside. For a BSI sensor, light can hit the photodiode through a direct path without the obstructions from the dielectric layers and interconnects located at the front side, which helps to increase the number of photons converted into electrons, and makes the MOS sensor more sensitive to the light source.

Three-dimensional (3D) integrated circuits (ICs) may be used to achieve a high density required for current applications, such as image sensor applications. When a MOS sensor is packaged in a 3D IC, a MOS sensor and its related application specific integrated circuit (ASIC) may be bonded to a carrier wafer in parallel, which may take a larger area for the carrier wafer. Therefore, there is a need for methods and systems to reduce the package area for MOS sensors related ASICs.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 2 illustrates a layout of an image sensor device in accordance with an embodiment;

FIG. 3A illustrates a top view of a layout design of a region in accordance with an embodiment;

FIG. 3B illustrates a top view of the region in FIG. 3A as implemented in a substrate in accordance with an embodiment;

FIG. 4A illustrates a top view of a doped region as formed in a substrate in accordance with an embodiment; and FIG. 4B illustrates a top view of the doped region in FIG. 4A after diffusion in accordance with an embodiment.

DETAILED DESCRIPTION OF ILLUSTRATIVE EMBODIMENTS

Figure 1:
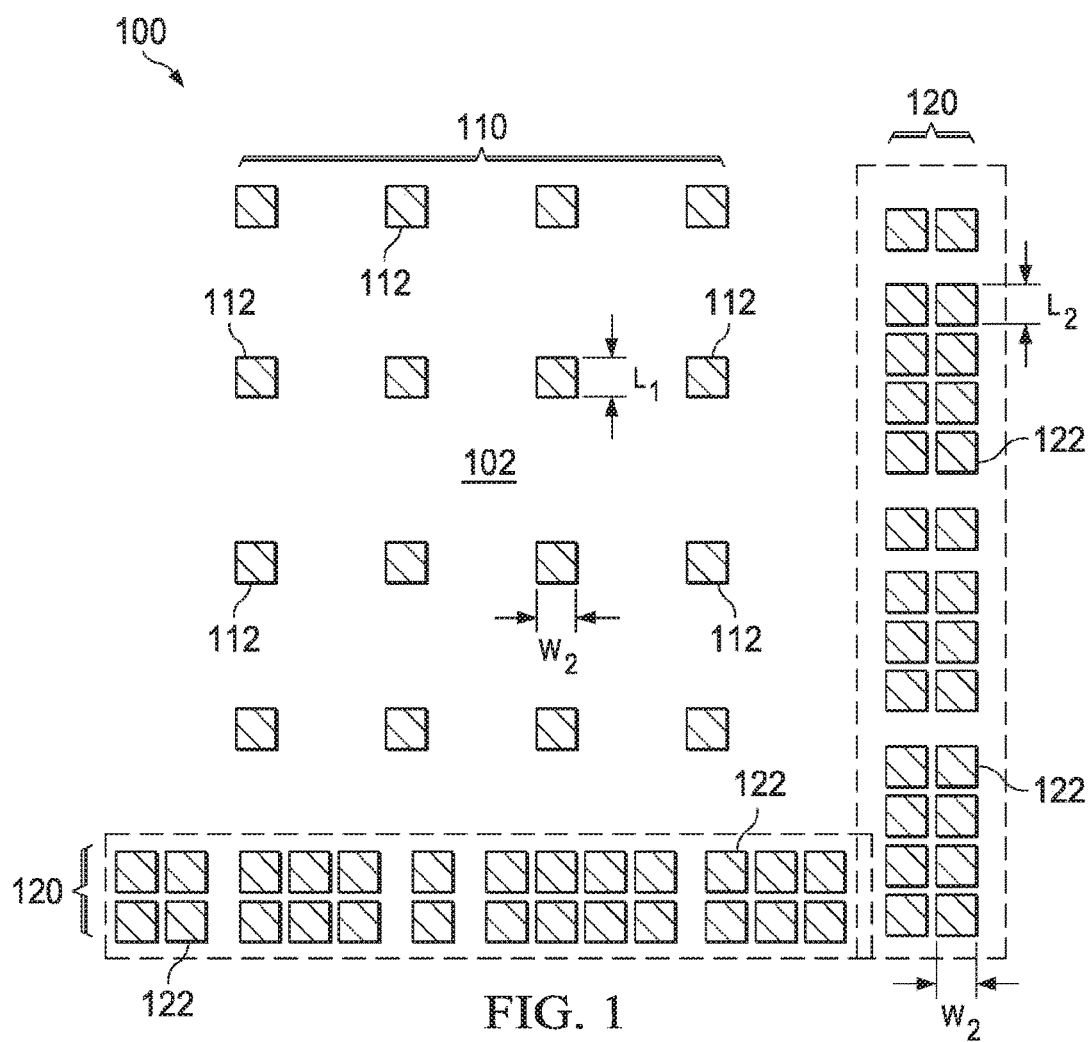
FIG. 1 illustrates a layout of a portion of an image sensor device in accordance with various embodiments.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely an image sensor semiconductor device. The embodiments of the disclosure may also be applied, however, to a variety of semiconductor devices.

While the sensors forming the pixel array may be described as being complementary metal-oxide-semiconductor (CMOS) elements, the pixel array may be comprised of charge coupled devices (CCDs) or any other photosensitive element.

FIG. 1 illustrates a layout of a portion of an image sensor device 100 in accordance with various embodiments. The image sensor device 100 includes a substrate 102, an array area no and one or more non-array areas 120. The array area no includes a plurality of pickups 112 and the non-array areas 120 include a plurality of pickups 122. The pickups 112 and 122 may also be referred to as well pickups 112 and 122. The array area no and the non-array area 120 are formed in the substrate 102. The non-array area 120 may partially or completely surround the array area no (see FIGS. 1 and 2). In some embodiments, the non-array area 120 may be proximate a periphery of the image sensor device 100. In some embodiments, the image sensor device 100 includes logic circuits, data processing circuits, bond pads, through vias, and the like. These circuits and structures may proximate a periphery of the image sensor device 100 and interposed between the periphery of the image sensor device 100 and the non-array area 120.

The substrate 102 may be a silicon substrate in some embodiments. In alternative embodiments, substrate 102 is formed of other semiconductor materials such as silicon germanium, silicon carbon, III-V compound semiconductors, or the like. In an embodiment, the substrate 102 is a bulk substrate that is formed of a homogeneous material, which means that the entire substrate 102 is formed of a same semiconductor material such as silicon, silicon germanium, silicon carbon, III-V compound semiconductors, or the like.

The pickups 112 and 122 are formed in the substrate 102. The pickups 112 and 122 may be formed in well regions (not shown). For example, p-type pickups may be formed in p-type wells and n-type pickups may be formed in n-type wells. The pickups 112 and 122 may be implanted with p-type and/or n-type and may be referred to as P+ and/or N+ pickups and may have the respective p-type and/or n-type impurity concentrations in the range from about 1E14/cm3 and 1E15/cm3, although higher or lower impurity concentrations may also be used. The n-type impurities may be phosphorus, arsenic, the like, or a combination thereof. The p-type impurities may be boron, gallium, indium, the like, or a combination thereof. As another example, the pickups 112 and 122 may be doped with the respective p-type and n-type impurity concentrations higher than about 1E19/cm3. It is appreciated, however, that the values recited throughout the description are merely examples, and may be changed to different values.

In an embodiment, the array area no is a pixel array no. The pixel array no may include a plurality of pixels (not shown) that may be arranged in rows and columns. Each of the pixels may include a photosensor and a pixel control circuit. In an embodiment, the photosensor includes a photodiode and a transfer transistor connected in series. In particular, the photodiode may act as a source for the transfer transistor, with the gate of the transfer transistor permitting electrons from the photodiode to flow through the transfer transistor when activated.

In an embodiment, the pixel control circuit includes a reset transistor, a source follower, and a select transistor. The reset transistor may be used to preset the voltage at the gate of the source follower. The source follower may provide a high impedance output for the pixel. The select transistor may be coupled to an output line to allow the data from the pixel to be processed by processing circuits.

In operation, light strikes the photosensitive region of the photodiode. In response, the photodiode generates an electrical charge proportional to the intensity or brightness of light. The electrical charge comprises free carriers transferred out of the photodiode by enabling the transfer transistor through a transfer signal applied to the gate of the transfer transistor. The electrical charge transferred from the photodiode by the transfer transistor enables the source follower transistor, thereby allowing an electrical charge proportional to the charge generated by the photodiode to pass from a voltage source through the source follower to the select transistor. When sampling is desired, a row select line is enabled, allowing the electrical charge to flow through the select transistor to the data process circuits coupled to the output of the select transistor.

An embodiment of an image sensor device 100 may comprise a plurality of pixels and pickups 112. In an embodiment, the pixels and pickups 112 may be arranged to form a two dimensional pixel array. The illustrated image sensor device 100 depicts a pixel array of size 4*4 by way of simplified example. The individual pixels may be read in multiplexed fashion, with a circuit controlling which row of a pixel array is addressed and separate circuitry controlling which column of a pixel array is addressed. Thus, a single pixel at an activated row and column may be read. Skilled practitioners will readily recognize that the presented embodiments may be applied to any size of pixel array without deviating from the embodied principles.

It should further be noted while the discussion above is a pixel in a four-transistor structure; a person skilled in art will recognize that the four-transistor structure is merely an example, which should not limit the scope of the present disclosure. One of ordinary skill in the art would recognize many variations, alternatives, and modifications. For example, various embodiments may include but not limited to three-transistor pixel, five-transistor pixel, a charge couple device (CCD) sensor, and the like.

In an embodiment, each of the pickups 112 has a corresponding pixel (not shown). In another embodiment, each of the pickups 112 may be used as a pickup for more than one pixel. The pickups 112 and 122 may be used to as a contact to the substrate or body of the image sensor device 100. In an embodiment, the pickups 112 are used to apply a voltage, such as a bias voltage to affect the electrical characteristics of the corresponding pixel. For example, the pickups 112 may be used to affect the threshold voltage of one or more of the devices in the corresponding pixels. The pickups 122 in the non-array area 120 may be used to apply a voltage, such as a bias voltage to affect the electrical characteristics of other devices on the image sensor device 100, such as logic circuits and data processing circuits outside of the pixel array area 110.

As illustrated in FIG. 1, the pickups 122 are more densely packed than the pickups 112. This may allow for the required amount of non-array pickup area while not reducing the size of the array area no. For example, one parameter affecting the performance of a pixel array is the fill factor, or area of a particular sensor occupied by each individual pixel. Larger pixels permit greater light sensitivity, and consequently, greater image quality. Larger pixels in a smaller sensor give a greater fill factor and result in greater performance-per-area. However, larger pixels and greater number of pixels require larger pixel array areas, and thus, it may be desired that the non-array area is reduced as much as possible.

In some embodiments, the pickups 112 and 122 are designed to have a rectangular shape when viewed from the top as illustrated in FIG. 1. The rectangular type pickups 112 and 122 illustrated in FIG. 1 may be referred to as point type pickups. In an embodiment, the pickups 112 are formed to have a width W1 and a length L1, with both the width W1 and the length L1 being in a range from about 0.1 μm to about 0.5 μm. In an embodiment, the pickups 122 are formed to have a width W2 and a length L2, with both the width W2 and the length L2 being in a range from about 0.1 μm to about 0.5 μm. In some embodiments, the widths W1 and W2 are substantially equal and the lengths L1 and L2 are substantially equal.

FIG. 2 illustrates a layout of an image sensor device 200 in accordance with an embodiment. The image sensor device 200 is similar to the image sensor device 100 described above, except that the pickups 122 completely surround array area 110. Details regarding this embodiment that are similar to those for the previously described embodiment are not repeated herein.

FIG. 3A illustrates a top view of a layout design of a pickup region in accordance with an embodiment and FIG. 3B illustrates a top view of the region in FIG. 3A as implemented in a substrate in accordance with an embodiment. The layout design in FIG. 3A may have a rectangular or square pickup region 302, but the actual pickup region 304 as formed in the substrate (see substrate 102 in FIGS. 1 and 2) may be circular or oval shaped as illustrated in FIG.

3B. This may be caused, for example, by the diffraction of the radiation beam used during the lithography of the pickups 112 and 122.

FIG. 4A illustrates a top view of a doped region as formed in a substrate in accordance with an embodiment, and FIG. 4B illustrates a top view of the doped region in FIG. 4A after diffusion in accordance with an embodiment. In an embodiment, the doped region 402 is the pickup region 304 in FIG. 3B. The impurities in the doped region 402 may diffuse outside of the designed layout to form a diffusion region 404 surrounding the doped region 402. The diffusion of the doped region 402 may be affected by subsequent thermal processes after the doped region 402 is doped such as an annealing process. The concentration of the diffusion region 404 has a lower concentration of the doped impurity than the doped region 402.

By having the pickups 112 in the array area no be similarly sized to the pickups 122 in the non-array area 120, the process window for the lithography steps to form the pickups 112 and 122 is increased. For example, if the pickups 122 for the non-array area 120 are large block type pickups and the pickups 112 in the array area are the point type pickups (see FIGS. 1 and 2), then the lithography process window for the patterning step of the pickups is much smaller due to issues such as, depth of focus and/or pattern loading. This may cause decreased yield in the image sensor device 100 and/or sacrificing of the critical dimension of the image sensor device 100. However, by having the pickups 112 and 122 of similar sizes, the lithography for patterning the pickups is more easily optimized and the critical dimension of the image sensor device 100 may be further reduced.

An embodiment is an image sensor device including a first plurality of pickup regions in a photosensor array area of a substrate, each of first plurality of pickup regions having a first width and a first length, a second plurality of pickup regions in a periphery area of the substrate, the periphery area along at least one side of the photosensor array area, each of second plurality of pickup regions having a second width and a second length.

Another embodiment is an image sensor device including an array of pickup regions in a photosensor array area of a substrate, the array of pickup regions being laterally apart from each other by a first spacing, and a plurality of pickup regions in a periphery area of the substrate, the periphery area extending along at least two sides of the photosensor array area, the plurality of pickup regions being spaced apart from each other by a second spacing, the second spacing being smaller than the first spacing.

A further embodiment is a method including forming a first plurality of pickup regions in a photosensor array area of a substrate, each of first plurality of pickup regions having a first width and a first length, and forming a second plurality of pickup regions in a periphery area of the substrate, the periphery area along at least one side of the photosensor array area, each of second plurality of pickup regions having a second width and a second length.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
an array of doped pickup regions in a photosensor array area of a top surface of a substrate, the substrate comprising silicon, each of the doped pickup regions of the array of doped pickup regions being separated from a nearest adjacent doped pickup region of the array of doped pickup regions by a first spacing, each of the doped pickup regions of the array of doped pickup regions having a different material composition than the substrate surrounding the corresponding doped pickup region, wherein each of the doped pickup regions of the array of doped pickup regions have a first width and a first length; and
a plurality of doped pickup regions in a periphery area of the top surface of the substrate, the periphery area extending along at least two sides of the photosensor array area, the periphery area of the substrate extending from an outer edge of the photosensor array area to an outermost edge of the substrate, each of the doped pickup regions of the plurality of doped pickup regions being separated from a nearest adjacent doped pickup region of the plurality of doped pickup regions by a second spacing, the second spacing being smaller than the first spacing, each of the doped pickup regions of the plurality of doped pickup regions having a different material composition than the substrate surrounding the corresponding doped pickup region, wherein each of the doped pickup regions in the array of doped pickup regions and each of the doped pickup regions in the plurality of doped pickup regions are substantially circular in a plane parallel to a top surface of the substrate, wherein each of the doped pickup regions in the plurality of doped pickup regions have a second width and a second length, wherein each of the first width, the second width, the first length, and the second length are from about 0.1 µm to about 0.5 µm, and wherein each of the doped pickup regions of the array of doped pickup regions and each of the doped pickup regions in the plurality of doped pickup regions comprise phosphorus, arsenic, boron, indium, gallium, or a combination thereof.

2. The device of claim 1, wherein each of the doped pickup regions in the array of doped pickup regions are substantially a same size as each of the doped pickup regions in the plurality of doped pickup regions.

3. The device of claim 1, wherein the plurality of doped pickup regions in the periphery area completely surrounds the array of doped pickup regions in the photosensor array area.

4. The device of claim 1, wherein each of the doped pickup regions in the array of doped pickup regions in the photosensor array area has a corresponding photodiode, and wherein the periphery area does not include any photodiodes.

5. The device of claim 1, wherein each of the array of doped pickup regions and the plurality of doped pickup regions comprises a p-type impurity.

6. The device of claim 1, wherein each of the array of doped pickup regions and the plurality of doped pickup regions comprises an n-type impurity.

7. A structure comprising:
a first plurality of doped pickup regions in a photosensor array area of a top surface of a substrate, the substrate comprising a semiconductor material, each of the first plurality doped pickup regions having a different material composition than the substrate surrounding the corresponding doped pickup region, each of the first plurality of doped pickup regions comprising an n-type or a p-type dopant, each of the first plurality of doped pickup regions being separated from a nearest adjacent doped pickup region of the first plurality of doped pickup regions by a first spacing, wherein each of the doped pickup regions in the first plurality of doped pickup regions have a first width and a first length; and
a second plurality of doped pickup regions in a periphery area of the top surface of the substrate, the periphery area extending along at least two sides of the photosensor array area, the periphery area of the substrate extending from an outer edge of the photosensor array area to an outermost edge of the substrate, each of the second plurality of doped pickup regions having a different material composition than the substrate surrounding the corresponding doped pickup region, each of the second plurality of doped pickup regions comprising an n-type or a p-type dopant, each of the second plurality of doped pickup regions being separated from a nearest adjacent doped pickup region of the second plurality of doped pickup regions by a second spacing, the second spacing being smaller than the first spacing, wherein each of the doped pickup regions in the second plurality of doped pickup regions have a second width and a second length, wherein each of the first width, the second width, the first length, and the second length are from about 0.1 µm to about 0.5 µm, and wherein each of the doped pickup regions in the first plurality of doped pickup regions and each of doped pickup regions in the second plurality of doped pickup regions comprise phosphorus, arsenic, boron, indium, gallium, or a combination thereof.

8. The structure of claim 7, wherein the photosensor array area comprises p-type doped well regions and n-type doped well regions in the top surface of the substrate, the p-type doped pickup regions of the first plurality of doped pickup regions being in the p-type doped well regions, the n-type doped pickup regions of the first plurality of doped pickup regions being in the n-type doped well regions.

9. The structure of claim 7, wherein each of the doped pickup regions in the first plurality of doped pickup regions are substantially a same size as each of the doped pickup regions in the second plurality of doped pickup regions.

10. The structure of claim 7, wherein each of the doped pickup regions in the first plurality of doped pickup regions and each of the doped pickup regions in the second plurality of doped pickup regions are substantially circular in a plane parallel to a top surface of the substrate.

11. The structure of claim 7, wherein the second plurality of doped pickup regions in the periphery area encircles the first plurality of doped pickup regions in the photosensor array area.

12. The structure of claim 7, wherein each of the doped pickup regions in the first plurality of doped pickup regions in the photosensor array area has a corresponding photodiode, and wherein the periphery area does not include any photodiodes.

13. The structure of claim 7, wherein each of the doped pickup regions of the second plurality of doped pickup regions is coupled to a logic circuit.

14. The structure of claim 7, wherein the photosensor array area comprises a plurality of photodiodes.

15. The structure of claim 7, wherein the second plurality of doped pickup regions in the periphery area are along only two sides of the first plurality of doped pickup regions in the photosensor array area.

16. An image sensor structure comprising:
a first plurality of doped pickup regions in a photo sensor array area of a substrate, the substrate comprising silicon, the first plurality of doped pickup regions being in a top surface of the substrate, each of the first plurality of doped pickup regions being a body contact of a corresponding photosensor in the photosensor array area, and each of the first plurality of doped pickup regions being separated from a nearest adjacent doped pickup region of the first plurality of doped pickup regions by a first spacing, wherein each of the doped pickup regions in the first plurality of doped pickup regions in the photosensor array area has a corresponding photodiode; and
a second plurality of doped pickup regions in a periphery area of the substrate, the periphery area along at least two sides of the photosensor array area, the periphery area of the substrate extending from an outer edge of the photosensor array area to an outermost edge of the substrate, the second plurality of doped pickup regions being in the top surface of the substrate, each of the second plurality of doped pickup regions being separated from a nearest adjacent doped pickup region of the second plurality of doped pickup regions by a second spacing, the second spacing being smaller than the first spacing, wherein the periphery area does not include any photosensor devices, wherein each of the first plurality of doped pickup regions and each of second plurality of doped pickup regions comprise phosphorus, arsenic, boron, indium, gallium, or a combination thereof, and wherein each of the first plurality of doped pickup regions and each of second plurality of doped pickup regions are substantially circular in a plane parallel to a top surface of the substrate;
wherein each of the doped pickup regions in the first plurality of doped pickup regions in the photosensor array area have a first width and a first length, wherein each of the doped pickup regions in the second plurality of doped pickup regions have a second width and a second length, wherein each of the first width, the second width, the first length, and the second length are from about 0.1 µm to about 0.5 µm.

17. The image sensor structure of claim 16, wherein the second plurality of doped pickup regions are along only two sides of the photosensor array area.

18. The image sensor structure of claim 16, wherein the second plurality of doped pickup regions are along four sides of the photosensor array area.

19. The image sensor structure of claim 16, wherein each of the doped pickup regions in the first plurality of doped pickup regions are substantially a same size as each of the doped pickup regions in the second plurality of doped pickup regions.

* * * * *